United States Patent [19]
Seyyedy et al.

[11] Patent Number: 5,376,817
[45] Date of Patent: Dec. 27, 1994

[54] STRUCTURE FOR A SEMICONDUCTOR DEVICE COMPRISING CONDUCTIVE TRENCH SIDEWALLS

[75] Inventors: Mirmajid Seyyedy; D. Mark Durcan, both of Boise, Id.

[73] Assignee: Micron Technology, Inc., Boise, Id.

[21] Appl. No.: 194,772

[22] Filed: Feb. 9, 1994

Related U.S. Application Data

[63] Continuation of Ser. No. 938,789, Sep. 1, 1992, abandoned, which is a continuation of Ser. No. 724,024, Jul. 1, 1991, abandoned.

[51] Int. Cl.$^5$ .................... H01L 27/02; H01L 23/48; H01L 23/40
[52] U.S. Cl. .................... 257/374; 257/773; 257/621
[58] Field of Search ............... 257/773, 624, 623, 774, 257/374, 621

[56] References Cited

U.S. PATENT DOCUMENTS

| | | | |
|---|---|---|---|
| 4,661,202 | 4/1987 | Ochii | 257/374 |
| 5,001,525 | 3/1991 | Kenney | 357/23.6 |

FOREIGN PATENT DOCUMENTS

| | | | |
|---|---|---|---|
| 63-304661 | 12/1988 | Japan | 257/374 |

*Primary Examiner*—Jerome Jackson
*Assistant Examiner*—Donald L. Monin, Jr.
*Attorney, Agent, or Firm*—Kevin D. Martin

[57] ABSTRACT

A structure for a semiconductor integrated circuit device comprises a p-type transistor and an n-type transistor, with each transistor having two diffusion regions. A trench interposed between the two transistors comprises a pair of conductively doped sidewalls. One sidewall is electrically coupled with power, and the other is electrically coupled with ground. A diffusion region from each transistor is electrically coupled with one of the sidewalls, with one transistor receiving power and the other receiving ground from the conductive sidewalls. The two transistor diffusion regions not electrically coupled with one of the sidewalls are electrically interconnected.

22 Claims, 9 Drawing Sheets

STRUCTURE FOR A SEMICONDUCTOR DEVICE COMPRISING CONDUCTIVE TRENCH SIDEWALLS

CROSS REFERENCE TO RELATED APPLICATION

This application is a continuation of U.S. patent application Ser. No. 07/938,789, filed Sep. 1, 1992, now abandoned, which was a continuation of U.S. patent application Ser. No. 07/724,024, filed Jul. 1, 1991, now abandoned.

FIELD OF THE INVENTION

The invention relates to the fabrication of semiconductor integrated circuit devices. More specifically, it describes a trench interconnect which requires less space than present interconnect means for denser surface geometry and, if formed between transistors, serves the added function of isolating the devices with no additional required surface area.

BACKGROUND OF THE INVENTION

Since the manufacture of integrated circuits (IC's) emerged as an industry in the early 1960's, designers have been motivated to make their products faster and less expensive by making them smaller. Beginning with the development of a single planar transistor in 1959, there has been generally a straight line progression in the number of components per IC on the order of a four-fold increase every four years throughout the 1960's, 1970's, and 1980's. Attendant to the increased geometric density of electronic functions has been a steady decline in price of a given function and generally increased operating speed. Consequently, improvement of IC in both function and cost is largely dependent on the continued reduction of feature size.

Prior to the invention of planar transistors and integrated circuitry, switching elements were very expensive relative to means of conduction and dominated design theory. The advent of the IC has reversed relative costs to the extent that switching elements, transistors, and associated components are essentially free in an IC relative to costs of conducting paths (hereafter, interconnects or buses).

As the number of layers and transistors in a logic device such as a microprocessor or very high density random access memory continues to increase, there is a corresponding need to increase the various buses within the logic device. The buses can serve any of several purposes, for instance to provide power ($V_{CC}$) or ground ($V_{SS}$) interconnects, to provide a data interconnect or other interconnects, or to provide digit lines or other signals. As the number of transistors on the device increases with improved technology, the increased number of buses required will require a greater percentage of the available surface area.

One way semiconductor memory devices have been reduced in size is to use trench capacitors as storage nodes. Trench capacitors are square or round wells which are etched vertically into the wafer. By selectively doping the structure and laying down layers of conductor and dielectric (nonconductor) material, a capacitor node is fashioned which can store a charge.

Trenches have been used with success on chip designs to isolate transistors to prevent the unwanted tunneling of electrons between transistors. While they serve this function well, they occupy much needed chip surface area.

SUMMARY OF THE INVENTION

An object of the invention is to provide a means of on-chip interconnect which requires less space and topology than present interconnect designs.

Another object of the invention is to provide a structure which can add additional function to a trench which has previously had a single main function, for instance to isolate transistors.

These objects of the invention are accomplished by first etching a trench in a starting substrate. The trench is fabricated in a manner consistent with present methods of trench manufacture as used in the semiconductor industry. The trench is an elongated structure running from point to point thereby forming a bus or other type of interconnect. If the trench is formed between devices, it can serve an added function of isolating the devices. Depending on how the structure is finished, a one conductor, two conductor, or three conductor bus can be manufactured.

If the trench is insulated and filled with a conductive material, a one conductor embodiment is formed.

If two diffusion areas, such as N+ or P+ areas, are implanted on either wall of the trench such that they are electrically isolated from each other, and the trench is filled with an insulator, a two conductor interconnect is formed.

If isolated diffusion areas, such as N+ or P+ areas, are implanted on either wall of the trench, an insulative layer is formed in the bottom and sides of the trench, and the trench filled with a conductive material, a three conductor interconnect can be formed.

The trench can be formed in a complete loop with contacts placed at any desired location. If the trench is not a loop, but instead terminates on either end, the conductive trench can be terminated so that the two N+ side wall areas do not short together with a trench structure etched before formation of the conductive trench and insulated with a material such as oxide.

DETAILED DESCRIPTION OF THE INVENTION

Figure 1:
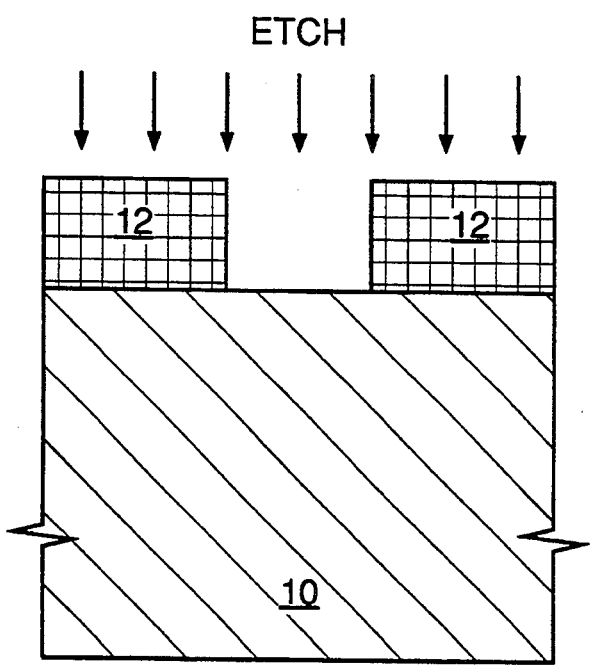
FIG. 1 is a cross section showing the formation of a trench.
Figure 2:
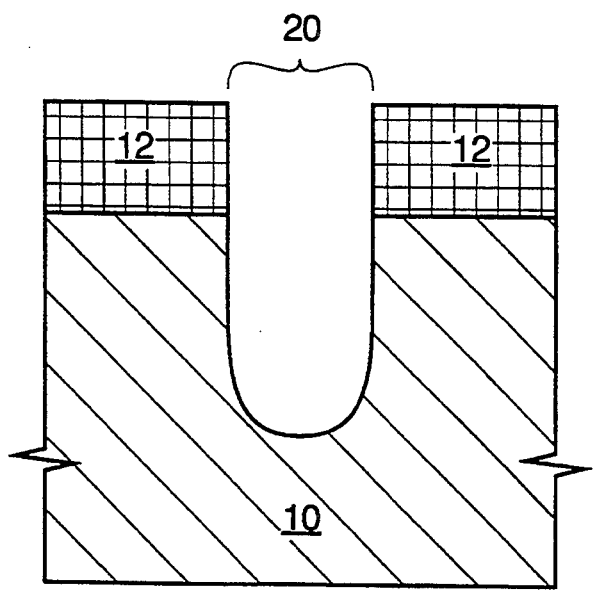
FIG. 2 shows a formed trench which is common to all embodiments.

As shown in FIG. 1, the inventive structure comprises a substrate material 10, which can be silicon, gallium arsenide, or other workable materials. In any case the substrate 10 is doped, for example to form a p-type material. A patterned layer of photoresist 12 is formed on the surface of the substrate 10. This photoresist pattern is used to etch a hard mask template for a trench to be etched into the surface of the substrate 10 or directly as mask for the trench etch. A completed trench 20 is shown in FIG. 2. The path of the trench 20 can be a straight line, and other paths are possible depending on the possible patterns of the photoresist 12. The photoresist is then removed. The structure of FIG. 2, with the photoresist 12 removed, is common to all embodiments and is referred to hereafter as the starting structure.

Figure 3:
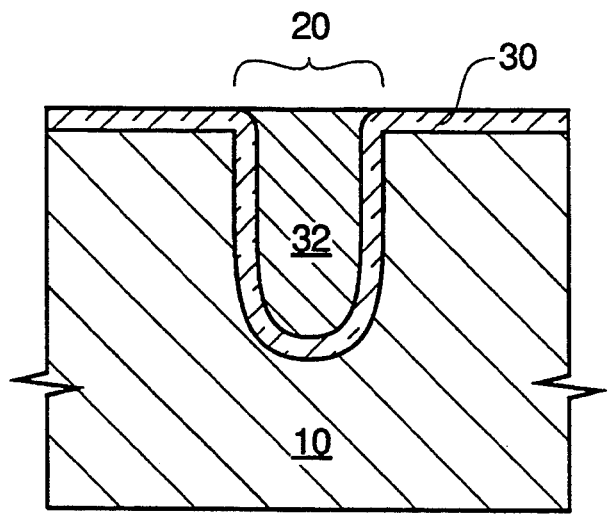
FIG. 3 describes a first embodiment of the invention having one conductive interconnect.

A first embodiment as shown in FIG. 3 comprises a layer of insulative material 30 such as oxides which coats the surface of the trench 20. The trench 20 is then filled with a conductive material 32 such as polycrystalline silicon (hereafter, poly), the conductive material 32 being separated from the substrate 10 by the insulating material 30. This conductive material 32 thereby forms the interconnect. This structure might be used as a bus having a low current drop by virtue of its relatively large size and capacity.

Figure 4:
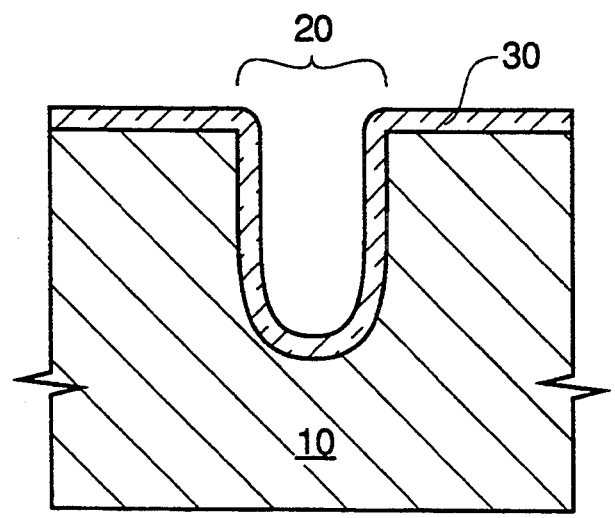
FIG. 4 shows the formation of an insulating layer over the trench area and the top of the substrate.
Figure 5:
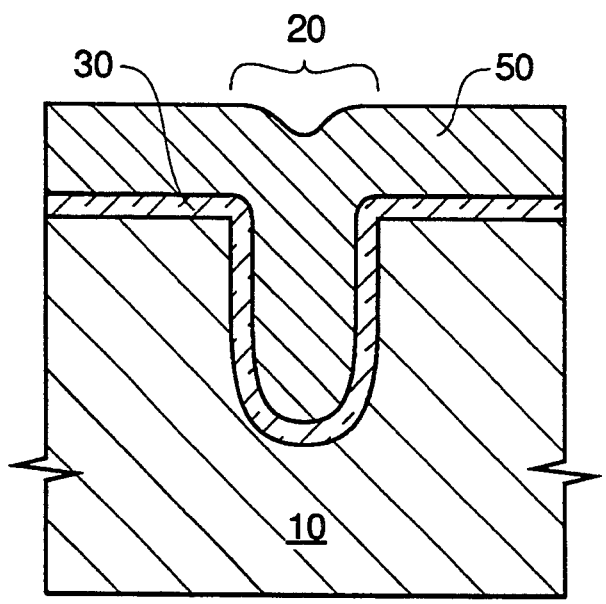
FIG. 5 shows the structure of FIG. 4 with the addition of a conductive layer formed over the substrate and filling the trench.

One way to form this first embodiment is to first grow a layer of oxide 30 on the sides and bottom of the trench 20 as shown in FIG. 4. If oxide is not desired on the surface of the substrate 10, nitride (not shown) would be patterned on the appropriate areas. Next, a layer of poly 50 is deposited thereby filling the trench 20 and covering the surface of the substrate 10 as shown in FIG. 5. The poly 50 on the surface of the substrate is then removed, leaving a poly conductor in the trench 20.

Figure 6:
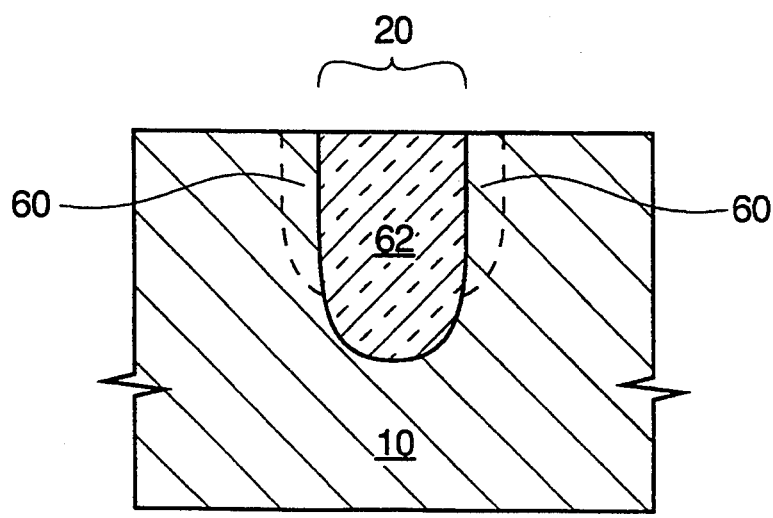
FIG. 6 is a cross section of a second embodiment of the invention having two conductive interconnects.

Referring to FIG. 6, a second embodiment has an N+ area 60 doped on at least one side, and in this particular embodiment on either side, of the trench 20 of the starting structure. A layer of insulating material 62 such as oxide then fills the trench 20, thereby electrically isolating the two N+ areas 60. The two N+ areas form the two legs of a two conductor bus.

Figure 7:
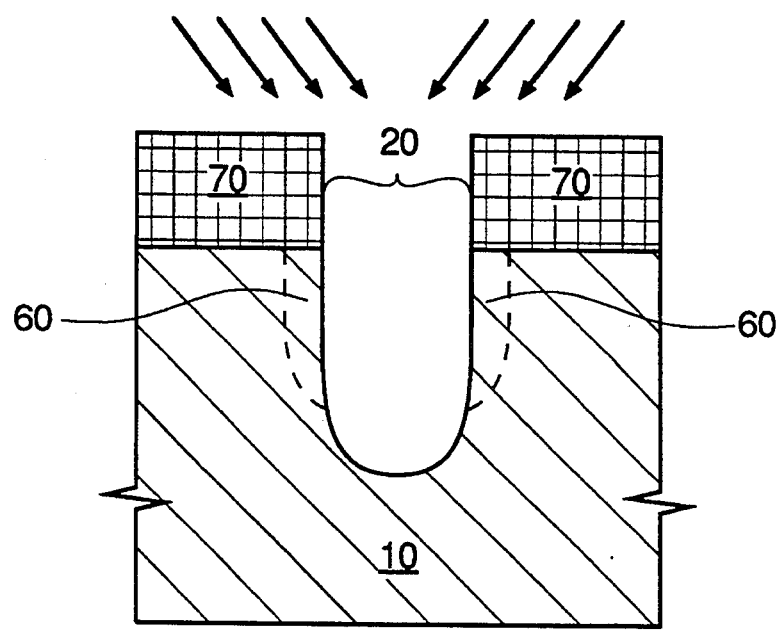
FIG. 7 describes a doping step which is a first means for forming the conductive areas of the second inventive embodiment.

The two N+ areas 60, one on either side of the trench 20, can be formed in at least two ways. A first way to form the pair of N+ areas 60 is to adjust the aspect ratio of the wafer as it is being doped as shown in FIG. 7. A layer of photoresist 70 on the surface of the substrate prevents it from being doped, while the unprotected trench area 20 is doped. The tilt of the wafer causes the sides of the trench to be doped while leaving the bottom of the trench undoped. The trench 20 is doped on each side by changing the angle of the wafer (or the angle of the implanter with respect to the wafer). Angling the aspect ratio of the wafer to dope the sides of the trench is a favorable doping method if the trench being doped is a straight line. Other methods may require an additional etch step.

Figure 8:
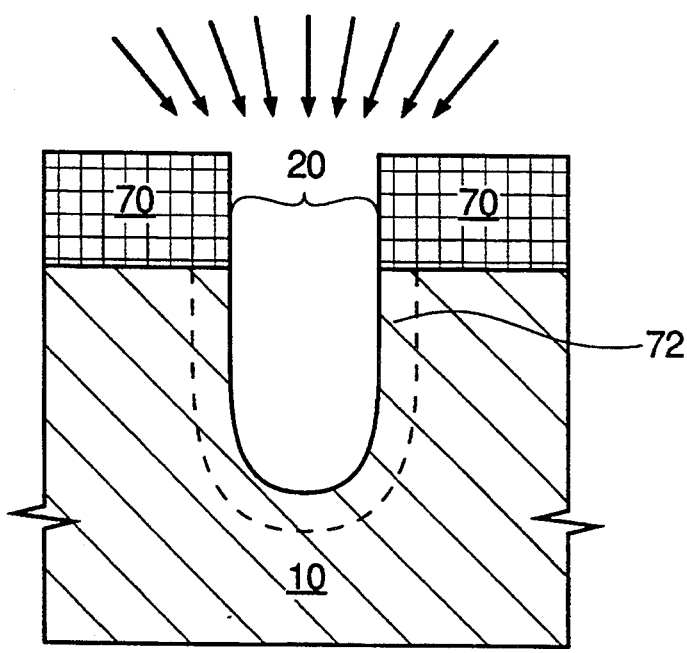
FIG. 8 shows a doping step which is a first step in a second means for forming the conductive areas of the second inventive embodiment.
Figure 9:
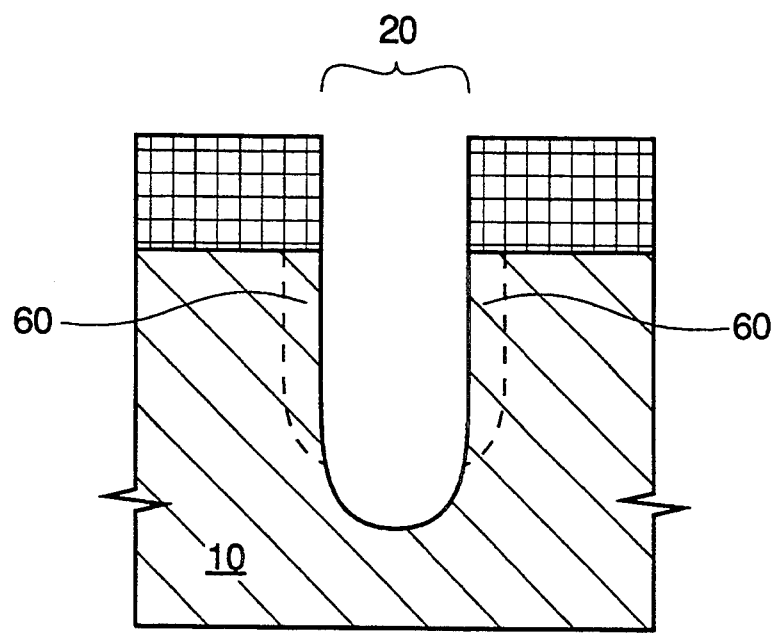
FIG. 9 shows the structure of FIG. 8 wherein the trench is further etched.

Referring to FIG. 8, a second way to form the pair of N+ areas is to dope the entire surface of the trench 20, sides and bottom, thereby creating a uniform N+ area 72. As shown in FIG. 9, an etch deepens the trench to a point below the doped area, thereby leaving two N+ areas 60. Additionally, the ends of the trench may require termination to prevent shorting of the two conductive areas, as is described later in this section. Re-etching the trench is used if the trench being doped does not form a straight line.

Figure 10:
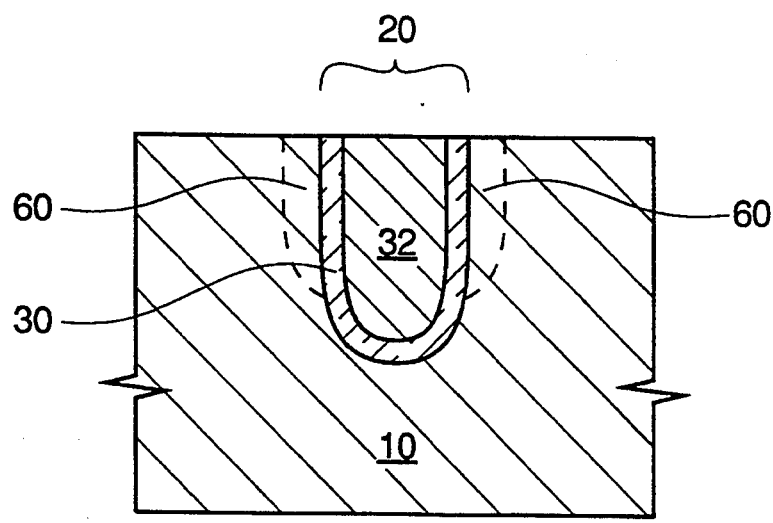
FIG. 10 is a cross section of a third inventive embodiment having three conductive interconnects.

A third embodiment of the invention as shown in FIG. 10 has an N+ area 60 doped on either side of the trench 20 of the starting substrate as with the second embodiment. A layer of insulator 30 such as oxide is formed on the sides and bottom of the trench 20, and the trench 20 is filled with a conductor 32 such as poly, as is described with the first embodiment. This embodiment provides for a three conductor interconnect in a very small three conductor interconnect in a very small area, the two N+ areas 60 forming two legs of the interconnect, and the poly 32 forming the third leg.

Figure 11:
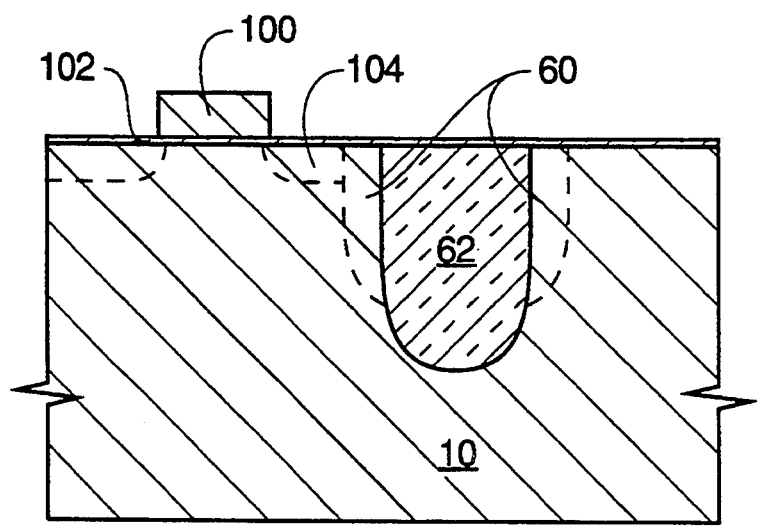
FIG. 11 shows a transistor formed on the substrate of an inventive embodiment.

As in FIG. 11, if a transistor having a gate 100 separated from the substrate 10 by an insulator 102 is formed with an N+ source or drain 104 shorted to one of the N+ areas 60 of the interconnect, the interconnect could function as control line to the transistor. This could replace the standard bit line structure in a dynamic random access memory device which superiorly positions the digit line with respect to the source or drain. This would serve to planarize the design of the semiconductor logic device, and would increase the possible semiconductor density. The self-aligned source or drain 104 is another advantage to the structure of FIG. 11. Note that FIG. 11 has an active device along the trench, but no active device along the sidewall of the trench. The drain 104 contacts the N+ area 60 which is along the sidewall.

The inventive interconnect structures would also serve to increase the feature density possible in logic devices such as microprocessors. As the number of transistors in the microprocessor increases, the inventive interconnect, which can be one micron or smaller in width, would replace the standard $V_{CC}$ and ground buses, which are 1–200 microns in width.

Figure 12:
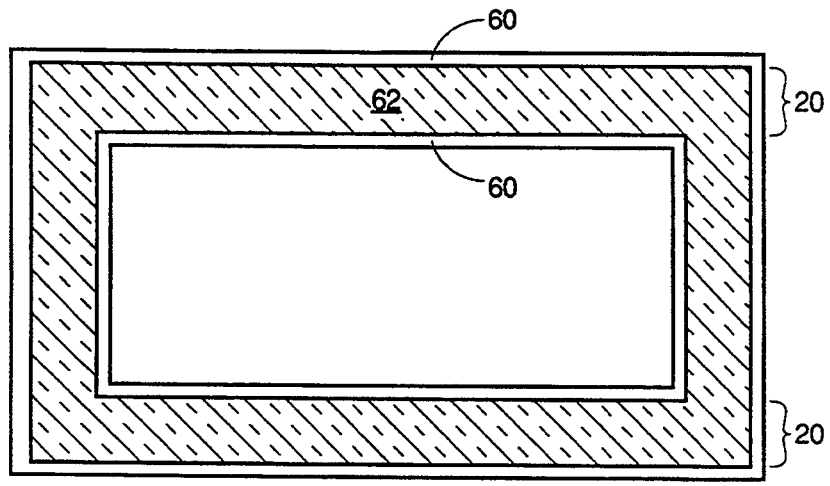
FIG. 12 is a top view showing a looped embodiment of the trench which does not require endpoint termination.

FIG. 12 is a top view of a loop trench 20 having conductors 60 on both walls of the trench 20, the trench 20 being filled with oxide 62. This is one possible configuration of the trench interconnect.

Figure 13:
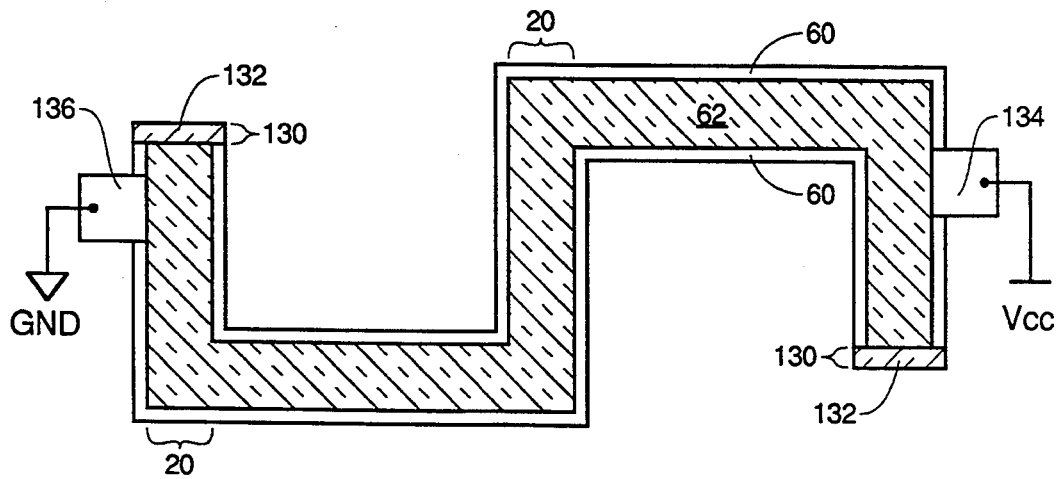
FIG. 13 shows a nonlooped interconnect which requires terminating trenches on either end.

FIG. 13 shows a two conductor interconnect bus structure which supplies $V_{CC}$ and $V_{SS}$. The trench is not a loop, but instead terminates on either end. If this structure is formed by rotating the wafer as it is being implanted, the N+ areas on either end of the trench would wrap around the ends of the trench and cause the two conductors 60 to be shorted together if means are not provided for preventing the shorting. One method of preventing this shorting is to form two terminating trenches 130 where the ends of the conductive trench will be formed, and the two terminating trenches 130 are filled with insulative material 132. The conductive trench 20 is formed and the sidewalls and bottom of the trench are doped with, for example, N+ material. The trench 20 is etched deeper to remove the N+ material which spans the bottom of the trench, thereby isolating the N+ areas on either sidewall.

A contact 134 is made to one of the conductive legs, and coupled with $V_{CC}$. A second contact 136 is made to the other conductive leg, and coupled with $V_{SS}$. Then, any other contacts made to the conductive legs can feed off the power 134 or ground 136.

Figure 14:
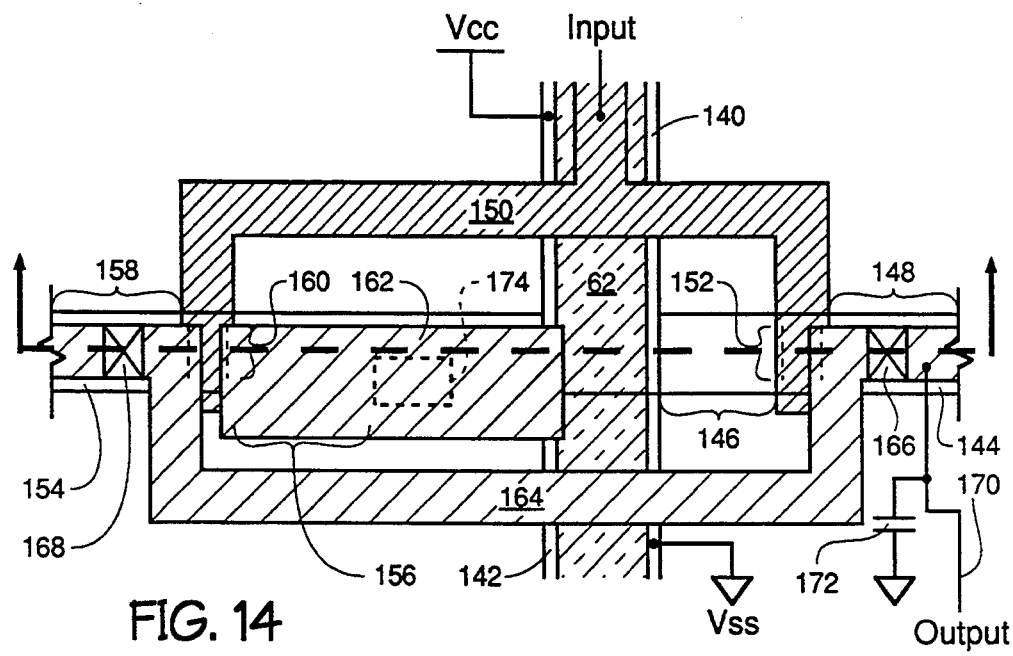
FIG. 14 shows a top view of one way to use the invention to form an inverter.

FIGS. 14 (top view) and 15 (cross section) show another possible way the conductive interconnect can be used. One conductive sidewall 140 is coupled with $V_{SS}$ and a second sidewall 142 is coupled with $V_{CC}$. Two transistors, one N transistor and one P transistor, are formed by doping the substrate and providing a gate consistent with methods known in the art.

The N transistor active area 144 forms a source 146 and a drain 148. A conductive material 150 such as poly forms the N transistor gate 152.

The P transistor active area 154 forms a source 156 and a drain 158. The P transistor source 156 and drain 158 are contained in an N− well 159 doped into the P type substrate 10. The conductive material 150 which forms the N transistor gate 152 also forms the P transistor gate 160.

Figure 15:
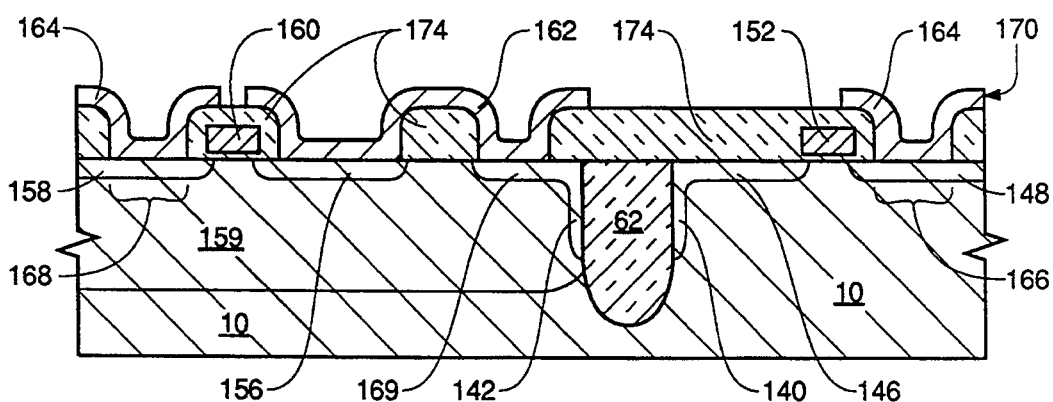
FIG. 15 shows a cross section of the FIG. 14 embodiment.

The N and P areas which make up the N and P transistor sources and drains can be formed in any workable manner, for example by doping with Arsenic or Phosphorous as N type dopants, and with Boron as a P type dopant. The gates 152, 160 can be manufactured from poly or any workable material. In any case, in the present inventive use of the invention the N+ source 146 of the N transistor contacts the N+ sidewall area 140 coupled with $V_{SS}$. The P+ source 156 of the P transistor is not directly contacted with the N+ area 142 of the $V_{CC}$ interconnect, but is coupled to the N+ interconnect 142 with a conductive material 162 such as metal. The drains of the two transistors 148, 158 are coupled by a conductor 164 such as metal, the conductor forming contacts 166, 168 to the transistor drains 148, 158. The material which forms the P to N area interconnect 162 and the material 164 which couples the drains 142, 158 can therefore be laid down in the same step. To allow a contact 162 to the $V_{CC}$ conductor 142, a contact area 169 may be doped in the substrate 10 so as to contact the $V_{CC}$ conductor 142. An output 170 is formed by the conductive material 164 of the transistor drains 148, 158, and is coupled through a capacitor 172 to ground. Note that in FIG. 15, a dielectric material 174 such as oxide insulates the conductive structures. The structure of FIGS. 14 and 15 therefore forms an inverter. A schematic of the FIG. 14 and 15 structure is shown in FIG. 16.

Figure 16:
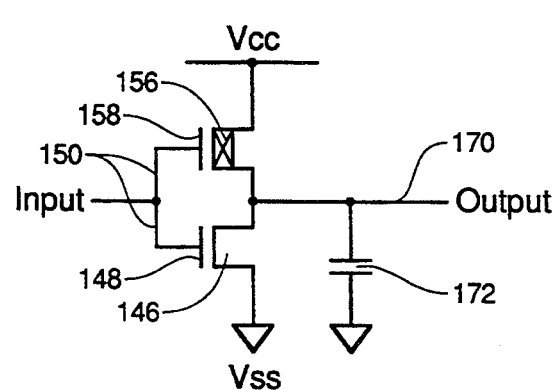
FIG. 16 shows a schematic representation of the inverter formed by the structure of FIGS. 14 and 15.
Figure 17:
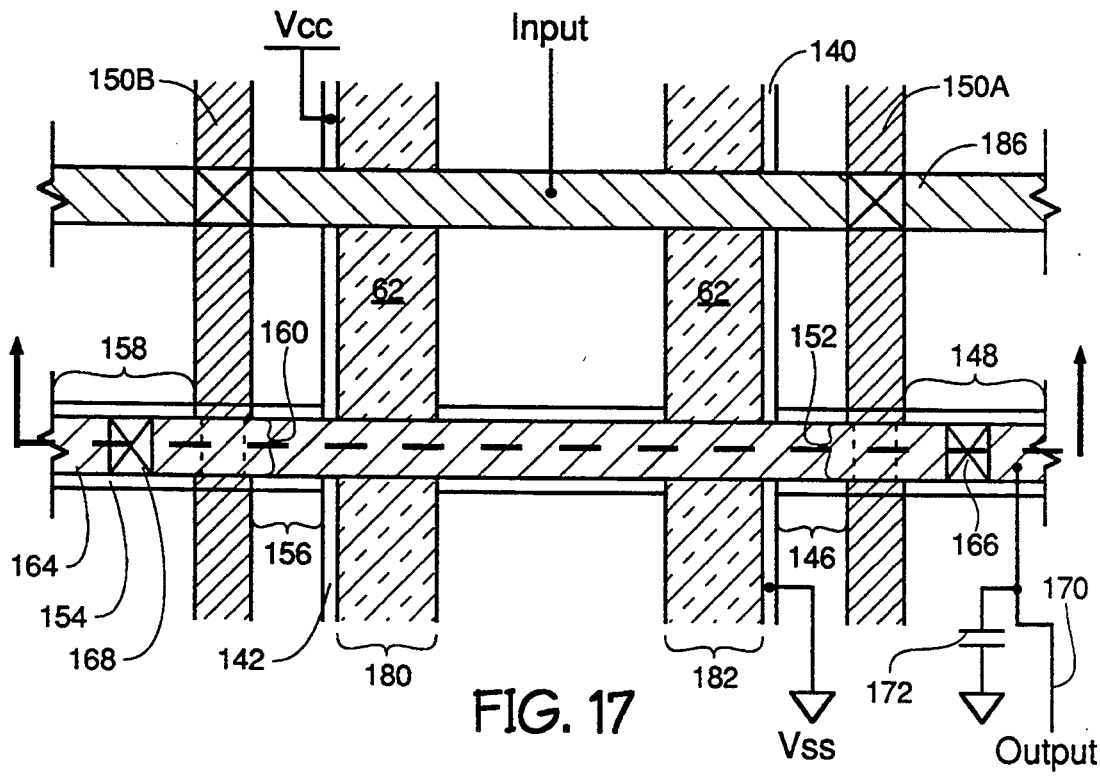
FIG. 17 is a top view of a second structural embodiment which forms an inverter.

FIGS. 17 (top view) and 18 (cross section) show another embodiment to form the inverter of FIG. 16 comprising two trenches 180, 182 with one transistor coupled with each trench. Trench 180, which is formed in a P-well 184 has a sidewall 142 coupled with $V_{CC}$, while trench 182 has a sidewall 140 coupled with $V_{SS}$. With this embodiment, it is not necessary to include structure 162 of FIGS. 14 and 15 which couples the P transistor source 156 with the N+ material 169 of the trench interconnect structure. It is also not necessary to terminate the trenches, for instance in the manner described by the terminating trenches 132 of FIG. 13. It is necessary, however, to add a metal structure 186 to contact the two different conductive structures 150a and 150b which make up the gates 152, 160 of the two transistors. This second embodiment may be more easily manufactured than the embodiment of the FIGS. 14 and 15, but may also be more expensive.

Figure 18:
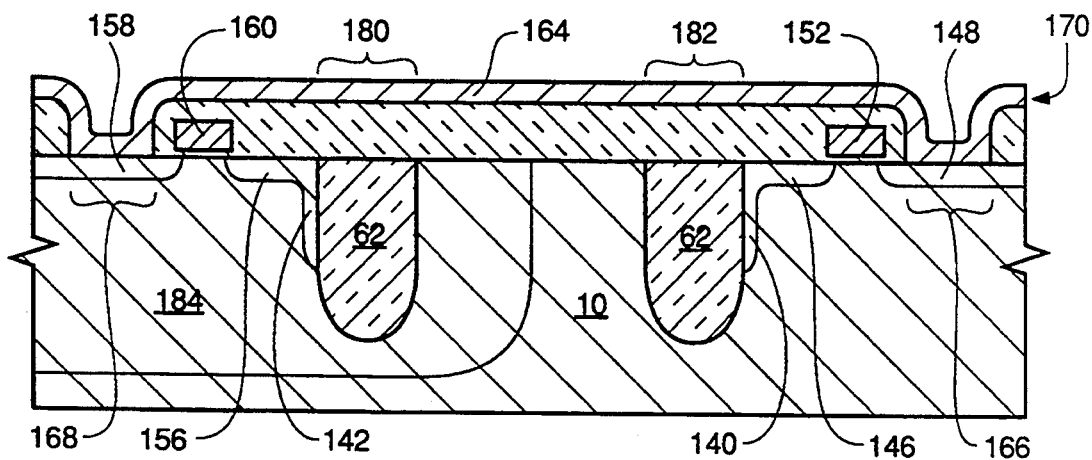
FIG. 18 is a cross section of the FIG. 17 embodiment.

A third inverter embodiment similar to the second inverter embodiment of FIGS. 17 and 18 may use a pair of single conductor trench interconnects as described with FIG. 3, but a contact to each of the poly conductors in the center of the trenches would replace the self-aligned transistors in the sidewall conductor embodiments. In many cases the disadvantages of the poly-filled trench interconnect would outweigh the advantages, as the self-aligned transistors of the sidewall interconnect are most attractive from both a design and implementation standpoint. In cases where reduced sheet resistance is required, however, using this poly-filled trench embodiment may be advantageous.

What have been described are specific configurations of the invention, as applied to particular embodiments. Clearly, variations can be made to the original designs described in this document for adapting the invention to other embodiments. For instance, the substrate material, as is well known in the art, can be an N-type material while the conductive regions are doped with a P-type material. The various conductors of the interconnect can be coupled with a variety of potentials signals. A variety of logic other than the inverter disclosed can be manufactured with the inventive interconnect by one of ordinary skill in the art. Also, processes other than those described may produce the final structure. Finally, various materials may be used to create the substrate, the insulators, and the conductors. Therefore, the invention should be read as limited only by the appended claims.

We claim:

1. A structure for a semiconductor integrated circuit device comprising:
   a) a substrate having a trench therein, said trench having first and second sidewalls;
   b) a first conductively doped region in said first sidewall electrically coupled with a first signal;
   c) a second conductively doped region in said second sidewall electrically coupled with a second signal;
   d) a first transistor comprising:
      i) a transistor gate formed over said substrate;
      ii) a first diffusion region electrically coupled with said conductively doped region in said second sidewall, and receiving said second signal thereby;
      iii) a second diffusion region;
   e) a second transistor comprising:
      i) a transistor gate formed over said substrate;
      ii) a first diffusion region electrically coupled with said conductively doped region in said first sidewall and receiving said first signal thereby;
      iii) a second diffusion region;
   f) plurality of transistors along said trench separate from said first and second transistors, each of said plurality of transistors having a diffusion region directly contacting one of said conductively doped regions in one of said sidewalls and receiving one of said signals therefrom.

2. The structure of claim 1 wherein said first transistor is a p-type transistor and said second transistor is an n-type transistor.

3. The structure of claim 2 wherein said first diffusion region of said first transistor is electrically coupled with said second-type conductively doped region in said second sidewall with a metal layer.

4. The structure of claim 3 wherein said first diffusion region of said first transistor is separated from said n- type conductively doped region in said second sidewall with an oxide layer on said surface of said substrate.

5. The structure of claim 2 wherein:
   said first- and second-conductively doped regions of said first and second sidewalls are both p-type conductively doped regions;
   b) said first diffusion region of said second transistor is electrically coupled with said conductively doped region in said first sidewall with a metal layer.

6. The structure of claim 5 wherein said first diffusion region of said second transistor is separated from said conductively doped region in said first sidewall with an oxide layer on said surface of said substrate.

7. The structure of claim 1 wherein said trench is filled with a nonconductor.

8. The structure of claim 1 wherein:
   a) said first conductively-doped region of said sidewall is doped n-type, and said first diffusion region of said second transistor contacts said first conductively-doped region of said sidewall; and
   b) said second conductively-doped region of said sidewall is doped p-type, and said first diffusion region of said first transistor contacts said second conductively-doped region of said sidewall.

9. The structure of claim 1, wherein said structure forms a portion of an inverter.

10. A structure for a semiconductor integrated circuit device comprising:
    a) a substrate having a trench therein, said trench having first and second sidewalls;
    b) an n-type conductively doped region in said first sidewall electrically coupled with a first signal;
    c) a p-type conductively doped region in said second sidewall electrically coupled with a second signal;
    d) a plurality of p-type transistors along said trench, each said p-type transistor comprising:
       i) a transistor gate formed over said substrate;
       ii) a first p-type diffusion region;
       iii) a second p-type diffusion region;
    e) an plurality of n-type transistors along said trench, each said n-type transistor comprising:
       i) a transistor gate formed over said substrate;
       ii) a first n-type diffusion region;
       iii) a second n-type diffusion region;
    wherein each of said first p-type diffusion regions of each of said p-type transistors is electrically coupled with said p-type conductively doped region in said second sidewall and receives said second signal thereby, and wherein each of said first n-type diffusion regions of each of said n-type transistors directly contacts said n-type conductively doped region in said first sidewall and receives said first signal thereby.

11. The structure of claim 10 wherein said trench is filled with a nonconductor.

12. The structure of claim 10 wherein at least one of said second p-type diffusion regions of one of said p-type transistors is electrically coupled with at least one of said second n-type diffusion regions of one of said n-type transistors.

13. The structure of claim 12 wherein said p-type diffusion region electrically coupled with said n-type diffusion region is electrically coupled through a metal layer which contacts said substrate.

14. The structure of claim 10 wherein said structure forms a portion of at least one inverter.

15. A structure for a semiconductor integrated circuit device comprising:

a) a substrate having a trench therein, said trench having first and second sidewalls;
b) an n-type conductively doped region in said first sidewall electrically coupled with a first signal;
c) a p-type conductively doped region in said second sidewall electrically coupled with a second signal;
d) a p-type transistor comprising:
   i) a transistor gate formed over said substrate;
   ii) a first p-type diffusion region electrically coupled with said p-type conductively doped region in said second sidewall, and receiving said second signal thereby;
   iii) a second p-type diffusion region;
e) an n-type transistor comprising:
   i) a transistor gate formed over said substrate;
   ii) a first n-type diffusion region electrically coupled with said n-type conductively doped region in said first sidewall and receiving said first signal thereby;
   iii) a second n-type diffusion region;
f) a plurality of transistors along said trench separate from said p-type and n-type transistors, each of said plurality of transistors having a diffusion region directly contacting one of said conductively doped regions in one of said sidewalls and receiving one of said signals therefrom.

16. The structure of claim 15 wherein said trench is filled with a nonconductor.

17. The structure of claim 15 wherein said second p-type diffusion region of said p-type transistor is electrically coupled with said second n-type diffusion region of said n-type transistor.

18. The structure of claim 17 wherein a metal layer electrically couples said second p-type diffusion region of said p-type transistor with said second n-type diffusion region of said n-type transistor.

19. The structure of claim 15 wherein said structure forms an inverter.

20. An inverter for a semiconductor integrated circuit device comprising:
    a) a substrate having a trench therein, said trench having first and second sidewalls;
    b) an n-type conductively doped region in said first sidewall electrically coupled with a ground signal;
    c) a p-type conductively doped region in said second sidewall electrically coupled with a power signal;
    d) a p-type transistor comprising:
       i) a transistor gate formed over said substrate;
       ii) a first p-type diffusion region electrically coupled with said p-type conductively doped region in said second sidewall, and receiving said power signal thereby;
       iii) a second p-type diffusion region;
    e) an n-type transistor comprising:
       i) a transistor gate formed over said substrate;
       ii) a first n-type diffusion region electrically coupled with said n-type conductively doped region in said first sidewall and receiving said ground signal thereby;
       iii) a second n-type diffusion region;
    f) a plurality of transistors along said trench separate from said transistors, each of said plurality of transistors having a diffusion region directly contacts one of said conductively doped regions in one of said sidewalls and receiving one of said signals therefrom.
wherein a metal layer electrically couples said second p-type diffusion region of said p-type transistor with said second n-type diffusion region of said n-type transistor.

21. The structure of claim 20 wherein said trench is filled with a nonconductor.

22. A structure for a semiconductor integrated circuit device comprising:
 a) a substrate having a trench therein, said trench having first and second sidewalls;
 b) a conductively doped region in said first sidewall electrically coupled with a signal;
 c) a plurality of transistors, each of said plurality of transistors comprising:
  i) a transistor gate formed over said substrate;
  ii) a first diffusion region forming a source region of said transistor;
  iii) a second diffusion region forming a drain region of said transistor,
wherein said transistors are formed along said trench and one of said diffusion regions of each of said plurality of transistors directly contacts said doped region in said first sidewall and receives said signal therefrom.

* * * * *